US010546949B2

(12) United States Patent
Manippady et al.

(10) Patent No.: US 10,546,949 B2
(45) Date of Patent: Jan. 28, 2020

(54) GROUP III NITRIDE BASED HIGH ELECTRON MOBILITY TRANSISTORS

(71) Applicant: Agency for Science, Technology and Research, Singapore (SG)

(72) Inventors: Krishna Kumar Manippady, Singapore (SG); Surani Bin Dolmanan, Singapore (SG); Kaixin Vivian Lin, Singapore (SG); Hui Ru Tan, Singapore (SG); Sudhiranjan Tripathy, Singapore (SG)

(73) Assignee: Agency for Science, Technology and Research, Singapore (SG)

( * ) Notice: Subject to any disclaimer, the term of this patent is extended or adjusted under 35 U.S.C. 154(b) by 0 days.

(21) Appl. No.: 14/758,035

(22) PCT Filed: Dec. 23, 2013

(86) PCT No.: PCT/SG2013/000547
§ 371 (c)(1),
(2) Date: Jun. 26, 2015

(87) PCT Pub. No.: WO2014/104973
PCT Pub. Date: Jul. 3, 2014

(65) Prior Publication Data
US 2015/0357451 A1      Dec. 10, 2015

(30) Foreign Application Priority Data

Dec. 26, 2012  (SG) .............................. 201209560-0

(51) Int. Cl.
*H01L 27/12*       (2006.01)
*H01L 29/778*      (2006.01)
(Continued)

(52) U.S. Cl.
CPC ............ *H01L 29/778* (2013.01); *C30B 25/02* (2013.01); *C30B 29/406* (2013.01);
(Continued)

(58) Field of Classification Search
CPC ......... H01L 29/66462; H01L 29/66431; H01L 29/7373; H01L 29/778
(Continued)

(56) References Cited

U.S. PATENT DOCUMENTS 7,910,937 B2      3/2011  Chen et al.
2002/0074552 A1*  6/2002  Weeks, Jr. .............. C30B 23/02
                                                         257/76
(Continued)

FOREIGN PATENT DOCUMENTS

GB        2485418           5/2012
GB    WO 2012066269 A1 *    5/2012    ....... H01L 21/02381
(Continued)

OTHER PUBLICATIONS

"International Application No. PCT/SG2013/000547, International Preliminary Report on Patentability dated Apr. 20, 2015", (Apr. 20, 2015), 23 pgs.
(Continued)

*Primary Examiner* — Tan N Tran
(74) *Attorney, Agent, or Firm* — Schwegman Lundberg & Woessner, P.A.

(57) ABSTRACT

Contemplated is a semiconductor device comprising: a substrate; a group (III)-nitride layer; a metal-group (III)-nitride layer deposited between the substrate and group (III)-nitride layer; and a metal-nitride layer deposited between the substrate and the metal-group (III)-nitride layer. Also a method for making a semiconductor device with the above mentioned structure is contemplated. Furthermore, the substrate can be a silicon on insulator (SOI) substrate;
(Continued)

the metal-nitride layer can be an aluminium nitride layer; the metal-group (III)-nitride layer can be an aluminium gallium nitride layer; and the group (III)-nitride layer can be a gallium nitride layer.

7 Claims, 4 Drawing Sheets

(51) Int. Cl.
  *H01L 21/02* (2006.01)
  *C30B 25/02* (2006.01)
  *C30B 29/40* (2006.01)
  *H01L 29/66* (2006.01)
  *H01L 29/20* (2006.01)

(52) U.S. Cl.
  CPC ...... *H01L 21/0254* (2013.01); *H01L 21/0262* (2013.01); *H01L 21/02381* (2013.01); *H01L 21/02433* (2013.01); *H01L 21/02458* (2013.01); *H01L 21/02505* (2013.01); *H01L 29/66462* (2013.01); *H01L 29/2003* (2013.01); *H01L 29/7786* (2013.01)

(58) Field of Classification Search
  USPC .................................................. 257/76, 347
  See application file for complete search history.

(56) References Cited

U.S. PATENT DOCUMENTS

| | | | |
|---|---|---|---|
| 2005/0006639 A1* | 1/2005 | Dupuis | H01L 21/02378 257/20 |
| 2008/0210949 A1 | 9/2008 | Makabe et al. | |
| 2010/0279461 A1 | 11/2010 | Yang et al. | |
| 2012/0119219 A1* | 5/2012 | Takado | H01L 21/02579 257/76 |
| 2012/0223365 A1* | 9/2012 | Briere | H01L 21/0237 257/194 |

FOREIGN PATENT DOCUMENTS

| | | | |
|---|---|---|---|
| WO | WO 2012066269 A1 * | 5/2012 | ....... H01L 21/02381 |
| WO | WO-2014/104973 | 7/2014 | |

OTHER PUBLICATIONS

"International Application No. PCT/SG2013/000547, International Search Report dated Feb. 11, 2014", (Feb. 11, 2014), 6 pgs.

Lee, Kang Jea, et al., "Reduction of dislocations in GaN epilayers grown on Si (111) substrate using Si x N y inserting layer", Applied physics letters 85.9, (Aug. 30, 2004), 1502-1504.

Tripathy, S., et al., "In Ga N/ Ga N light emitting diodes on nanoscale silicon on insulator", Applied Physics Letters 91.23, (Dec. 5, 2007), 231109.

Wang, L. S., et al., "Effects of periodic delta-doping on the properties of GaN: Si films grown on Si (111) substrates", Applied physics letters 85.24, (Dec. 13, 2004), 5881-5883.

Wieneke, Matthias, et al., "Micro-structural anisotropy of a-plane GaN analyzed by high resolution X-ray diffraction", physica status solidi (c) 6.S2, (Feb. 16, 2009), S498-S501.

Celler, G. K., et al., "Frontiers of silicon-on-insulator", J. Appl. Phys., vol. 93, No. 9, May 1, 2003, (May 1, 2003), 4955-4978.

* cited by examiner

GROUP III NITRIDE BASED HIGH ELECTRON MOBILITY TRANSISTORS

PRIORITY CLAIM TO RELATED APPLICATIONS

This application is a U.S. national stage application filed under 35 U.S.C. § 371 from International Application Serial No. PCT/SG2013/000547, which was filed 23 Dec. 2013, and published as WO 2014/104973 on 3 Jul. 2014, and which claims priority to Singapore Application No. 201209560-0, filed 26 Dec. 2012, which applications and publication are incorporated by reference as if reproduced herein and made a part hereof in their entirety, and the benefit of priority of each of which is claimed herein.

TECHNICAL FIELD

The present invention generally relates to a semiconductor device for high-power applications. The present invention also relates to the method of making such a device.

BACKGROUND

GaN-based high electron mobility transistors (HEMTs) are high-frequency transistors suitable for applications in communication satellites, power amplifiers and other high-power electronic devices. Growth of GaN on a bulk Si platform offers a cost effective method that may lead to high manufacturing yield compared to conventional methods using sapphire and SiC substrates. However, high lattice and thermal mismatch between Si and GaN leads to tensile stress which results in cracking, high density of threading dislocations and severe epilayer bowing due to in-plane strain. The non-uniform composition/thickness in the layer structure complicates the electrical properties and leads to compromised device performance. Further, the inability to grow thick, crack-free GaN layers make them unsuitable for application in high voltage devices. The severe bowing of the substrate also disallows the use of thin bulk Si as a substrate. Due to these reasons, large scale commercial application of high-voltage Ga-on-Si devices has been difficult, consequently hampering the development of high performance, cost-effective HEMT devices which could have significant industrial implications.

Several techniques have been developed in an attempt to relieve the stress in the layer structure and to create crack-free GaN-on-Si. This includes the incorporation of superlattices or low-temperature AlN interlayers in the GaN layer. Although these methods are useful for LED applications, in the case of HEMT they give rise to multilayers of two-dimensional electron gas (2DEG) interfaces which cause the device to become leaky and less efficient as line defect density increases. Further, the incorporation of these features cause the growth time of the layers to increase, limiting the time and cost efficiency of the production of the device.

There is therefore a need to provide a high-performance, cost-effective GaN-on-Si device that overcomes, or at least ameliorates, one or more of the disadvantages described above.

SUMMARY

According to a first aspect, there is provided a device comprising a substrate, a group(III)-nitride layer, a metal-group(III)-nitride layer deposited between the substrate and group(III)-nitride layer and a metal nitride layer deposited between the SOI and the metal-group(III)-nitride layer.

Advantageously, such a semiconductor device may have improved properties suitable for use in high-power applications. Further advantageously, by having a thicker, crack-free and homogeneous group(III)-nitride layer, wherein the group(III)-nitride comprises GaN, grown over a thick metal group(III)-nitride layer wherein the metal group(III)-nitride comprises AlGaN, and a thick metal nitride layer, wherein the metal nitride comprises AlN, low structure bowing may be achieved. The low structure bowing may result in the improvement in uniformity of the layers and consequently the electrical properties of the device. Further advantageously, this may circumvent the use of conventional techniques that may compromise the performance of the device.

In one embodiment, such a device may comprise an AlN layer that may have a thickness dimension selected to reduce bowing of the structure. Advantageously, the AlN layer may reduce the strain induced by thermal mismatch between the GaN and SOI layer. Further advantageously, the AlN layer may provide a better interface for deposition of the AlGaN layer. The AlGaN layer may be deposited as a gradient, further contributing to the reduction of strain in the epilayers, resulting in prevention of bowing of the structure and cracking of the GaN layer.

Advantageously, such a device provided may have superior crystalline quality in the epilayers and improved electrical properties for use as a high electron mobility (HEMT) device.

According to a second aspect, there is provided a method of making a semiconductor device, the method comprising the steps of: (a) providing a substrate, (b) depositing a metal-nitride layer on the substrate, (c) depositing a metal-group(III)-nitride layer on the metal-nitride layer and (d) depositing a group(III)-nitride layer on the metal-group(III)-nitride layer.

Advantageously, this method of making the semiconductor device may allow the use of a Si(111) handle SOI as the substrate, decreasing the production cost of the semiconductor device by up to 70 percent compared to traditional substrates such as sapphire and SiC. Further advantageously, this method may offer versatility in post-growth processing, mitigating the use of thick Si substrates.

Further advantageously, this method of making the semiconductor device may shorten the production time of the device by up to 30 percent compared to traditional methods by careful selection of temperature and pressures for the deposition of each epilayer. This may allow each epilayer to be of sufficient thickness and homogeneity, facilitating cost- and time-effective manufacture of the device According to a third aspect, there is also provided a use of the semiconductor device.

DEFINITIONS

The following words and terms used herein shall have the meaning indicated:

The term 'thick', for the purposes of referring to GaN in this disclosure, refers to GaN layers with thicknesses of at least 1.7 mu.m.

The term 'step-graded', for the purposes of referring to the manufacture of the semiconductor device in this disclosure, is to be interpreted broadly to refer to layers of homogeneous compositions wherein the percentage composition of at least one of the components of the composition gradually increases or decreases in discrete steps between adjacent consecutive layers.

The term 'bowing' is to be interpreted broadly to refer to bending or curving of a material both in the concave and convex directions about a longitudinal axis.

The word "substantially" does not exclude "completely" e.g. a composition which is "substantially free" from Y may be completely free from Y. Where necessary, the word "substantially" may be omitted from the definition of the invention.

Unless specified otherwise, the terms "comprising" and "comprise", and grammatical variants thereof, are intended to represent "open" or "inclusive" language such that they include recited elements but also permit inclusion of additional, unrecited elements.

As used herein, the term "about", in the context of concentrations of components of, the formulations, typically means +/−5% of the stated value, more typically +/−4% of the stated value, more typically +/−3% of the stated value, more typically, +/−2% of the stated value, even more typically +/−1% of the stated value, and even more typically +/−0.5% of the stated value.

Throughout this disclosure, certain embodiments may be disclosed in a range format. It should be understood that the description in range format is merely for convenience and brevity and should not be construed as an inflexible limitation on the scope of the disclosed ranges. Accordingly, the description of a range should be considered to have specifically disclosed all the possible sub-ranges as well as individual numerical values within that range. For example, description of a range such as from 1 to 6 should be considered to have specifically disclosed sub-ranges such as from 1 to 3, from 1 to 4, from 1 to 5, from 2 to 4, from 2 to 6, from 3 to 6 etc., as well as individual numbers within that range, for example, 1, 2, 3, 4, 5, and 6. This applies regardless of the breadth of the range.

Certain embodiments may also be described broadly and generically herein. Each of the narrower species and sub-generic groupings falling within the generic disclosure also form part of the disclosure. This includes the generic description of the embodiments with a proviso or negative limitation removing any subject matter from the genus, regardless of whether or not the excised material is specifically recited herein.

DISCLOSURE OF OPTIONAL EMBODIMENTS

Exemplary, non-limiting embodiments of a semiconductor device, will now be disclosed. In the example embodiments described below, the product and its manufacturing process of a GaN/AlGaN epilayer structure on an SOI substrate is discussed in order to demonstrate a high power semiconductor device.

A semiconductor device comprising a substrate, a group (III)-nitride layer, a metal-group(III)-nitride layer deposited between the substrate and group(III)-nitride layer and a metal nitride layer deposited between the substrate and the metal-group(III)-nitride layer, is discussed. Advantageously, this layer structure of the device may allow low bowing of the layers in the device, which may allow improvement in uniformity of the layers and consequently the electric properties of the device. This may allow the device to be used in high-power applications.

The substrate may be provided as a silicon-on-insulator (SOI) substrate. The SOI substrate, where there is a layer of thin Si on a Si handle, may offer a cost-effective alternative to traditionally used substrates. The SOI substrate may also offer versatility in post-growth processing, mitigating the use of thick Si substrates.

The SOI substrate may be provided as a high resistive Floatzone SOI which may comprise a bulk Si(111) overlayer, a buried oxide layer and a Si handle support.

The SOI substrate may have a diameter of 150 mm or 200 mm. The thickness of the Si(111) overlayer may vary from about 50 nm to about 200 nm, about 50 nm to about 100 nm, about 50 nm to about 150 nm, about 100 nm to about 150 nm, about 100 nm to about 200 nm or about 150 nm to about 200 nm in different substrates with a buried oxide thickness range of about 50 nm to about 500 nm, about 50 nm to about 150 nm, about 50 nm to about 300 nm, about 50 nm to about 500 nm, about 150 nm to about 300 nm, about 150 nm to about 500 nm or about 300 nm to about 500 nm. The thickness of the Si handle may vary from about 650 mu.m to about 675 mu.m, about 650 mu.m to about 660 mu.m, about 650 mu.m to about 670 mu.m, about 660 mu.m to about 670 mu.m, about 660 mu.m to about 675 mu.m or about 670 mu.m to about 675 mu.m with a resistivity of in the range of about 100 Ωcm to about 10,000 Ωcm.

The group(III)-nitride layer may comprise gallium nitride (GaN) with a thickness that may be in the range of about 2.0 mu.m to 5.0 mu.m, about 2.0 mu.m to about 3.0 mu.m, about 2.0 mu.m to about 4.0 mu.m, about 3.0 mu.m to about 4.0 mu.m, about 3.0 mu.m to about 5.0 mu.m or about 4.0 mu.m to about 5.0 mu.m. This thickness of the GaN layer may impart better electrical properties for the semiconductor device.

The metal-group(III)-nitride layer may comprise aluminium gallium nitride (AlGaN) with various Al compositions and a total thickness that may be greater than or equal to about 1.0 mu.m.

The metal-nitride layer may comprise aluminium nitride (AlN). The AlN layer may have a thickness between about 300 nm to about 600 nm, about 300 nm to about 400 nm, about 300 nm to about 500 nm, about 400 nm to about 500 nm, about 400 nm to about 600 nm or about 500 nm to about 600 nm. This thickness of the AlN layer may allow growth of a thick GaN layer for better electrical properties of the semiconductor device.

The content of Al from the AlN layer to the GaN layer may be present in an amount to reduce strain between the GaN and SOI. This amount of Al may vary between about 20 percent to about 60 percent, about 20 percent to about 25 percent, about 20 percent to about 30 percent, about 20 percent to about 35 percent, about 20 percent to about 40 percent, about 20 percent to about 45 percent, about 20 percent to about 50 percent, about 20 percent to about 55 percent, about 25 percent to about 30 percent, about 25 percent to about 35 percent, about 25 percent to about 40 percent, about 25 percent to about 45 percent, about 25 percent to about 50 percent, about 25 percent to about 55 percent, about 25 percent to about 60 percent, about 30 percent to about 35 percent, about 30 percent to about 40 percent, about 30 percent to about 45 percent, about 30 percent to about 50 percent, about 30 percent to about 55 percent, about 30 percent to about 60 percent, about 35 percent to about 45 percent, about 35 percent to about 50 percent, about 35 percent to about 55 percent, about 35 percent to about 60 percent, about 40 percent to about 45 percent, about 40 percent to about 50 percent, about 40 percent to about 55 percent, about 40 percent to about 60 percent, about 45 percent to about 50 percent, about 45 percent to about 55 percent, about 45 percent to about 60 percent, about 50 percent to about 55 percent or about 50 percent to about 60 percent.

The content of Al from the AlN layer to the GaN layer in the AlGaN layer may decrease in content from the AlN layer to the GaN layer. This amount may vary from about 40 percent to about 60 percent, about 40 percent to about 45 percent, about 40 percent to about 50 percent, about 40 percent to about 55 percent, about 45 percent to about 50 percent, about 45 percent to about 55 percent, about 45 percent to about 60 percent, about 50 percent to about 55 percent, about 50 percent to about 60 percent or about 55 percent to about 60 percent Al immediately adjacent to the AlN layer to about 20 percent to about 30 percent, about 20 percent to about 25 percent or about 25 percent to about 30 percent Al immediately adjacent to the GaN layer. This decrease in Al content in the AlGaN layer may decrease the strain between the GaN layer and the AlN layer.

The content of Al from the AlN layer to the GaN layer in the ALGaN layer may be provided as discrete layers of decreasing Al content from the AlN layer to the GaN layer to ensure that the compressive bowing of the epilayers is smooth.

The AlGaN layer may comprise three discrete layers with decreasing Al content. The decreasing Al content in the layers may decrease the strain between the GaN and AlN layer. The first AlGaN layer immediately adjacent to the AlN layer may have an Al composition of about 50 percent to about 60 percent, about 50 percent to about 55 percent or about 55 percent to about 60 percent. The second AlGaN layer immediately adjacent to the first AlGaN layer may have an Al composition of about 30 percent to about 40 percent, 30 percent to about 35 percent or 35 percent to 40 about percent. The third AlGaN layer immediately adjacent to the second AlGaN layer and the GaN layer may have an Al composition of about 20 percent to about 25 percent.

The thickness of the AlGaN layers may be selected based on the starting thickness of the SOI substrate.

The AlN layer disposed between the SOI and AlGaN layer may have a thickness dimension that is less than the thickness dimension of the combined AlGaN layers. The thickness of the AlN layer being thinner than the AlGaN layer may ensure the growth of a thick GaN layer.

The thickness of the AlN and ALGaN layers may depend on the starting thickness of the SOI substrate.

The AlN layer deposited between the SOI and AlGaN layer may have a thickness dimension selected to reduce bowing of the epilayer in the device.

The combined AlN/AlGaN/GaN thickness may reduce bowing of the device.

The GaN layer may be of a substantially homogeneous structure. This may comprise a layer that is compositionally homogeneous as well as structurally homogeneous. The homogeneous structure may allow better electrical properties for use in high-power applications. The GaN layer must not have cracks to ensure uniform electrical properties. The homogeneous GaN layer excludes structures that comprise a GaN/AlGaN superlattice or a low temperature AlN interlayer. The GaN may have a thickness dimension that is greater than the thickness dimension of the combined AlN and AlGaN layers to allow improved electrical properties.

When the thickness dimension of GaN is about 1.0 mu.m, the combined AlN and AlGaN layers may have a thickness dimension of less than 1.0 mu.m. When the thickness dimension of GaN is about 2.0 mu.m, the combined AlN and AlGaN layers may have a thickness dimension of less than 2.0 mu.m or less than 1.0 mu.m. When the thickness dimension of GaN is about 3.0 mu.m, the combined AlN and AlGaN layers may have a thickness dimension of less than 3.0 mu.m, less than 2.0 mu.m or less than 1.0 mu.m. When the thickness dimension of GaN is about 4.0 mu.m, the combined AlN and AlGaN layers may have a thickness dimension of less than 4.0 mu.m, less than 3.0 mu.m, less than 2.0 mu.m or less than 1.0 mu.m. When the thickness dimension of GaN is about 5.0 mu.m, the combined AlN and AlGaN layers may have a thickness dimension of less than 5.0 mu.m, less than 4.0 mu.m, less than 3.0 mu.m, less than 2.0 mu.m or less than 1.0 mu.m.

GaN layers of sufficient thickness and homogeneity suitable for high-power applications as high electron mobility transistors (HEMTs) may be produced while avoiding traditionally timely and/or costly manufacturing techniques (such as incorporation of superlattices and low temperature interlayers in the GaN layer and/or the use of expensive substrates including sapphire and SiC).

In the case of GaN growth on SOI substrates, the strain may be partitioned among nitride layers and a thin silicon overlayer due to the compliant nature of such a composite structure. This strain balance mechanism may be achieved through layering of AlN and AlGaN between the GaN and Si substrate such that bowing of the overall structure is reduced compared to the case of growing GaN directly onto bulk Si substrates. A low bow structure may allow uniform thickness and superior crystalline properties of each layer, improving the electrical properties of the two-dimensional electron gas (2DEG) interfaces necessary for high-performance transistors.

A method of making a semiconductor device, the method comprising the steps of; (a) providing a substrate, (b) depositing a metal-nitride layer on the substrate, (c) depositing a metal-group(III)-nitride layer on the metal-nitride layer and (d) depositing a group(III)-nitride layer on the metal-group(III)-nitride layer, is discussed.

All the deposition steps in the present invention may be performed using Metal Organic Chemical Vapour Deposition (MOVCD), a technique well known in the art. A modified AIXTRON 19×2 inch Close coupled showerhead (CCS) MOCVD reactor may be used for the manufacture of the semiconductor device. The reagents may be introduced into the reactor through a water-cooled showerhead surface covering the entire area of deposition. The showerhead may be placed close to the substrate and may be constructed to enable the reagents to be separated until immediately prior to injection onto the substrate. This separation may be achieved through the use of a multiplicity of small tubes in separate orifices.

The method comprising the step of maintaining the temperature of the substrate at a substantially uniform heat profile during steps (a) to (d) may be achieved using a CCS MOCVD reactor equipped with an in-situ reflectivity and curvature measurement tool as well as a rotating susceptor which may be resistively heated with a three-zone heater.

The substrate may be a SOI substrate that may be provided as a high resistive Floatzone SOI, prepared by the separation by implantation of oxygen (SIMOX) process. The reactor may operate with a single 200 mm or 150 mm diameter SOI structure. The SOI surface may be cleansed using dry in-situ $H_2$ dry etch cleaning. The $H_2$ anneal etch clean to remove the native oxide may be performed in-situ in the CCS MOCVD reactor chamber. The reactor temperature may be ramped up to a range of about 1200° C. to about 1250° C. thermocouple temperature with a $H_2$ carrier gas flow rate range of about 35 slm to about 45 slm.

During the cleansing process, the SOI substrate may be unintentionally exposed to $NH_3$ gas. This may help to reduce the out diffusion of Si wherein the nitridation of Si is self-limiting due to the formation of a $Si_xN_y$ layer that may oppose the Si out-diffusion during growth. The unintentional exposure to $NH_3$ may lead to an absence of amorphisation of the SOI, providing a better surface for the subsequent deposition steps to follow.

The SOI may be pre-treated with simultaneous $NH_3$ flow and trimethyl aluminium (TMAl) release.

The metal nitride layer comprising aluminium nitride (AlN) may be deposited on the SOI substrate by MOCVD in two separate steps. The deposition process of the AlN layer may be started by placing the SOI substrate on top of the resistively heated rotating susceptor. Since buried oxides on the surface of the SOI may change the surface temperature profiles, the three-zone heater in the rotating susceptor may enable modification of the temperature profile to provide temperature uniformity over the susceptor diameter.

The method comprising the deposition of the metal nitride layer in step (a) may be performed using an alkyl metal in the presence of a nitrogen source. The alkyl metal may comprise trimethyl aluminium (TMAl) and the nitrogen sources may comprise $NH_3$ gas.

The first AlN growth step may comprise the growth of low-temperature (LT) AlN at a thickness range of about 30 nm to about 50 nm, about 30 nm to about 35 nm, about 30 nm to about 40 nm, about 30 nm to about 45 nm, about 35 nm to about 40 nm, about 35 nm to about 45 nm, about 35 nm to about 50 nm, about 40 nm to about 45 nm, about 40 nm to about 50 nm or about 45 nm to about 50 nm at a growth pressure range of about 30 Torr to about 100 Torr, surface temperature range of about 900° C. to 1000° C. and $NH_3$ flow rate of about 500 sccm to about 1500 sccm.

The second AlN growth step may comprise the growth of high-temperature (HT) AlN at a thickness range of about 300 nm to about 400 nm, about 300 nm to about 325 nm, about 300 nm to about 350 nm, about 300 nm to about 375 nm, about 325 nm to about 350 nm, about 325 nm to about 375 nm, about 325 nm to about 400 nm, about 350 nm to about 375 nm, about 350 nm to about 400 nm or about 375 nm to about 400 nm at a growth pressure between about 30 Torr to about 100 Torr, surface temperature between about 1050° C. to about 1075° C. and $NH_3$ flow rate between about 500 sccm and about 5000 sccm.

The metal-group(III)-nitride layer comprising aluminium gallium nitride (AlGaN) may be deposited on the AlN layer by sequentially changing the MOCVD growth sequence. The method for providing the content of Al from the AlN layer to the GaN layer in an amount to reduce strain between the GaN and SOI may be to measure in situ curvature. Epicurve triple TT sensors may be used to monitor the curvature of the substrate which may enable adjustment of reagent composition depending on the extent of bowing of the substrate. Resistively heated susceptor may enable modification of the temperature profile during deposition of the reagents to provide temperature uniformity over the susceptor diameter.

The method comprising the step of reducing the amount of Al in the AlN layer during step (C) may comprise the decrease in the amount of Al included in the composition of the reagents injected into the CCS MOCVD reactor as the curvature of the substrate decreases. The method comprising the reducing step for the deposition of discrete layers of decreasing Al content in the AlGaN layer may be step-graded deposition of the reagents. Step grading may provide a curvature profile that gives a smooth compressive bowing of the epilayers at the relevant growth temperatures.

The method comprising the step of measuring the curvature of the substrate and then adjusting the amounts of AlGaN during step (c) may be to estimate the compressing bowing slope on the SOI in situ and use that information to tune the reagent composition necessary for injection into the reactor to achieve strain relief. The temperature of the deposition reaction may be ramped accordingly such that the layers may be grown at a constant temperature throughout to ensure uniform composition in each layer.

The surface growth temperature range of the step-graded AlGaN layers may be between about 1020° C. to about 1050° C., about 1020° C. to about 1030° C., about 1020° C. to about 1040° C., about 1030° C. to about 1040° C., about 1030° C. to about 1050° C. or about 1040° C. to about 1050° C.

The AlGaN layer may be deposited at a pressure range of about 75 Torr to about 100 Torr, about 75 Torr to about 80 Torr, about 75 Torr, to about 85 Torr, about 75 Torr to about 90 Torr, about 75 Torr to about 95 Torr, about 80 Torr to about 85 Torr, about 80 Torr to about 90 Torr, about 80 Torr to about 95 Torr, about 80 Torr to about 100 Torr, about 85 Torr to about 90 Torr, about 85 Torr to about 95 Torr, about 85 Torr to about 100 Torr, about 90 Torr to about 95 Torr, about 90 Torr to about 100 Torr or about 95 Torr to about 100 Torr.

The flow ratio of trimethyl aluminium (TMAl) and trimethyl gallium (TMGa) may be adjusted based on the compressive bowing slope.

The group(III)-nitride layer comprising gallium nitride (GaN) may be deposited on the AlGaN layer by a two-step MOCVD growth process to achieve high quality GaN.

The first undoped GaN layer may be grown at a thickness range of about 300 nm to about 1000 nm, about 300 nm to about 400 nm, about 600 nm to about 800 nm, about 400 nm to about 600 nm, about 400 nm to about 800 nm, about 400 nm to about 1000 nm, about 600 nm to about 800 nm, about 600 nm to about 1000 nm or about 800 nm to about 1000 nm at a pressure range of about 100 Torr to about 400 Torr, about 100 Torr to about 200 Torr, about 100 Torr to about 300 Torr, about 200 Torr to about 300 Torr, about 200 Torr to about 400 Torr or about 300 Torr to about 400 Torr and at temperatures ranges of about 1000° C. to 1050° C., about 1000° C. to 1025° C., about 1025° C. to 1050° C. The slow growth rate of GaN during this step may annihilate possible point and line defects that may appear close to the buffer AlGaN/GaN interfaces.

The second undoped GaN layer may be grown at a thickness range of about 1.75 mu.m to about 5 mu.m, about 1.75 mu.m to about 2 mu.m, about 1.75 mu.m to about 3 mu.m, about 1.75 mu.m to about 4 mu.m, about 2 mu.m to about 3 mu.m, about 2 mu.m to about 4 mu.m, about 2 mu.m to about 5 mu.m, about 3 mu.m to about 4 mu.m, about 3 mu.m to about 5 mu.m or about 4 mu.m to about 5 mu.m at a relatively low pressure of between about 150 Torr to about 200 Torr, about 150 Torr to about 160 Torr, about 150 Torr to about 170 Torr, about 150 Torr to about 180 Torr, about 150 Torr to about 190 Torr, about 160 Torr to about 170 Torr, about 160 Torr to about 180 Torr, about 160 Torr to about 190 Torr, about 160 Torr to about 200 Torr, about 170 Torr to about 180 Torr, about 170 Torr to about 190 Torr, about 170 Torr to about 200 Torr, about 180 Torr to about 190 Torr, about 180 Torr to about 200 Torr or about 190 Torr to about 200 Torr. The growth steps may be carried out at a temperature range between about 1000° C. to about 1075° C., about 1000° C. to about 1025° C., about 1000° C. to about 1050° C., about 1025° C. to about 1050° C., about 1025° C. to about 1075° C. or about 1050° C. to about 1075° C. The growth rate at lower pressure is higher due to the incorporation of carbon in the GaN from the unintentional background doping. This step may allow the growth of high-quality GaN layers of sufficient thickness without requiring the insertion of interlayers.

High pressure GaN may be grown for LED applications. Low pressure GaN may be grown for transistor applications where background carbon incorporation takes place giving rise to lower vertical leakage.

BRIEF DESCRIPTION OF DRAWINGS

The accompanying drawings illustrate a disclosed embodiment and serves to explain the principles of the disclosed embodiment. It is to be understood, however, that the drawings are designed for purposes of illustration only, and not as a definition of the limits of the invention.

EXAMPLES

Non-limiting examples of the invention and comparative examples will be further described in greater detail by reference to specific Examples, which should not be construed as in any way limiting the scope of the invention.

Example 1

Experimental—Growth of AlGaN/GaN HEMT on 150 mm Diameter Silicon-Based Substrate The studied AlGaN/GaN high electron mobility transistors (HEMT) epitaxial structures were grown using an AIXTRON CCS 19×2-inch metal organic chemical vapour deposition (MOCVD) system on 150 mm diameter Si (111) substrates. Prior to the growth of the layers, an in-situ surface oxide cleaning of the Si substrate was performed by hydrogen flow in the MOCVD reactor. This was followed by a short duration pre-treatment with trimethyl aluminum (TMAl). A low-temperature (LT) AlN nucleation layer of thickness about 25 nm was initially grown on the Si substrate followed by a high-temperature (HT) AlN layer of thickness greater than 300 nm. This HT-AlN was grown at about 75 Torr at a temperature range of about 1050 to 1075° C.

Three step-graded AlGaN intermediate layers were subsequently grown on the HT-AlN layer with an Al composition of about 50 to 60 percent, about 30 to 40 percent and about 20 to 25 percent in the first, second and third AlGaN layers, respectively; the first AlGaN layer being directly adjacent to the HT-AlN layer. The Al composition estimation was performed based on high resolution X-ray diffraction (HRXRD) measurements. The thickness of each layer was selected based on the starting Si substrate thickness. The growth was typically carried out at a pressure range of 75 to 100 Torr and a temperature range of about 1020 to 1050° C. with TMAl/trimethyl gallium (TMGa) flow ratio adjustments.

For the growth of the GaN layer, the typical surface temperature measured by an in-situ growth monitoring tool was about 1040° C. The typical pressure window was about 100 to 400 Torr. The HEMT structure consisted of a thin AlN spacer layer, $Al_{0.25}Ga_{0.75}N$ barrier layer and an undoped GaN cap layer with thicknesses of about 1.0 to 1.3 nm, about 21 to 22 nm and about 1.5 to 2.0 nm, respectively.

Example 2

Characterization—Epilayer Bowing

Figure 1:
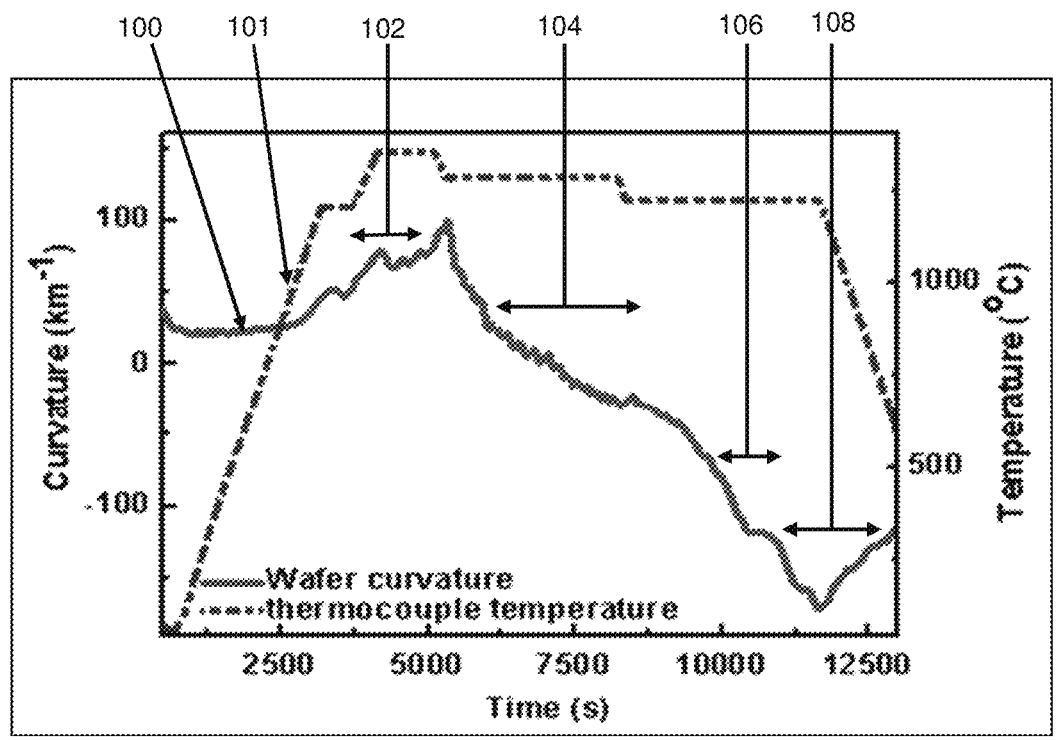
FIG. 1 is a graph depicting the in-situ wafer curvature profile during the growth of the epilayers on the SOI substrate.

FIG. 1 shows the in-situ wafer curvature profile during the growth of the epilayers. The curvature profile for AlN layer 102, AlGaN buffer layer 104, GaN layer 106 and HEMT layer 108 are shown. AlN layer 102 displays the highest curvature which decreases as more epilayers are added on. The detailed in-situ curvature profile shows a clear sign of compressive stress at growth temperatures recorded during the deposition of the undoped GaN layer 106 on AlGaN buffer layers 104, leading to low epilayer bowing when the sample is cooled down to room temperature. The HEMT layer 108 growth on such an SOI substrate has shown bowing less than or equal to 50 mu.m.

Figure 2:
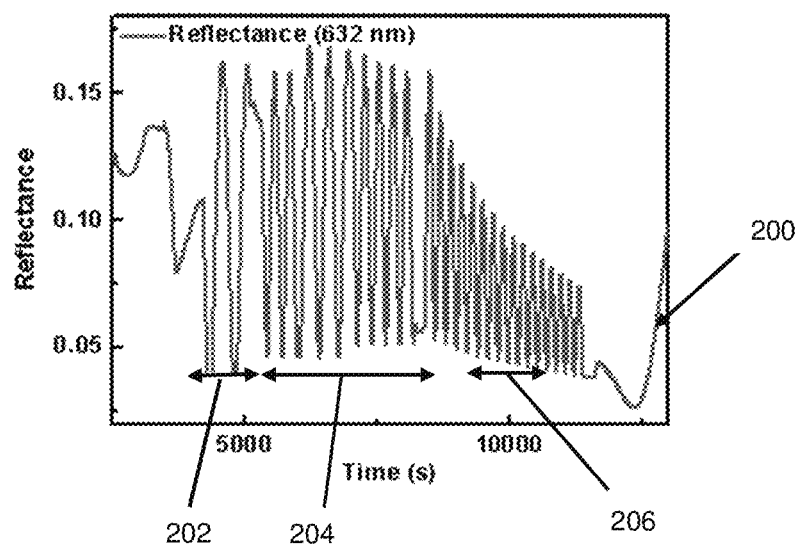
FIG. 2 is a graph depicting a typical reflectivity profile of the epilayer structure.

FIG. 2 shows the typical reflectivity profile of HEMT deposition. The relative change of reflectance is shown to explain the changes that occurred at various stages of the growth sequence. Due to the high reflectivity of the substrate, the asymmetry lineshape is expected at 632 nm. The reflectance of the AlN layer 202, AlGaN layer 204 and GaN layer 206 are shown. The reflectivity change in the substrate affects the line shape. The oscillations in the reflectance were therefore used to indirectly determine the thickness of individual layers.

Example 3

Characterization—Electrical Properties

The electrical measurements were performed on the device using Hall measurements. A series of samples grown on such high resistive SOI substrates shows an average sheet resistivity range of 425 to 450 Ω/sq. The sheet carrier density of the 2-dimensional electron gas (2DEG) is comparable with the case when bulk Si is used. A slightly higher room temperature average electron mobility of about 1700 $cm^2$/Vs with uniform variation of 10 to 12 percent in various samples was achieved, representing an improvement in uniformity at the 2DEG interfaces compared to that when a bulk Si substrate with the same handle thickness was used. The Hall data uniformity was checked by using diced 1 cm×1 cm sample pieces from wafer center to wafer edge.

Example 4

Characterization—Crystalline Quality

Figure 3A:
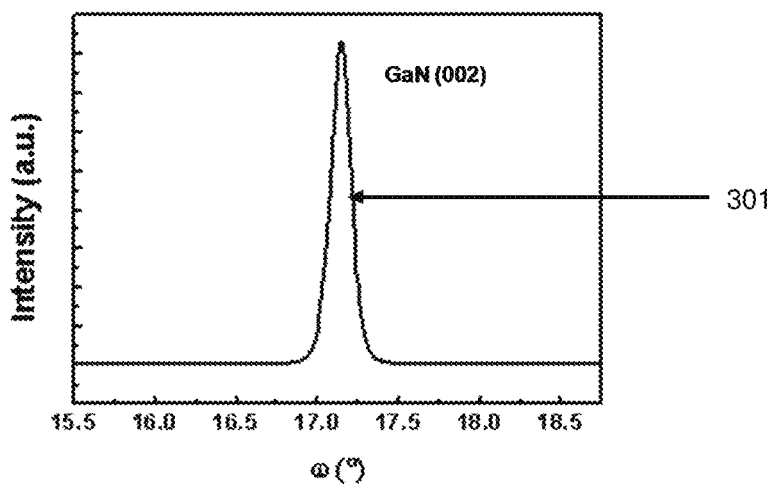
FIGS. 3 (a) and (b) are graphs depicting the HRXRD rocking curves of GaN (002) and GaN (102) reflections, respectively.
Figure 3B:
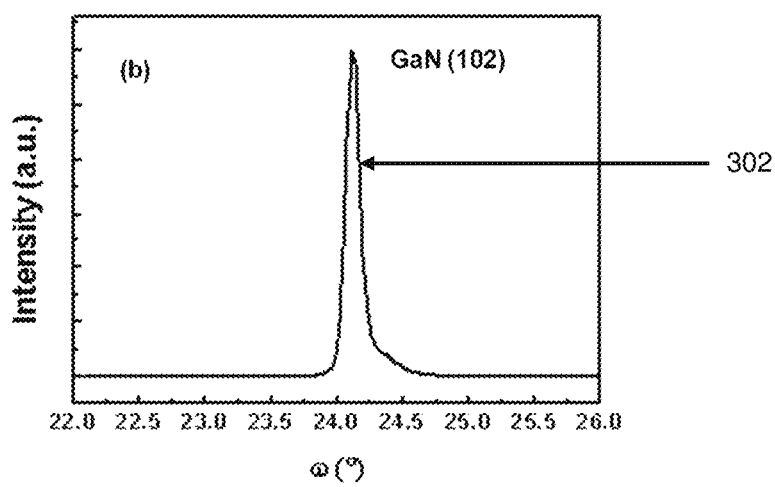

To analyse the crystalline quality of the HEMT layer structure on SOI, high resolution X-ray diffraction (HRXRD) measurements were performed. FIG. 3 shows the rocking curves of GaN in the (002) plane 301 and (102)

planes 302 from the nitride stack. HRXD measurements show a rocking curve full width at half maximum (FWHM) of about 446 and 478 acrsecs for the GaN (002) 301 and (102) 302 reflections, respectively. These values show that the crystalline quality of the GaN layer is very good given that the total nitride thickness is greater than or equal to 3.75 mu.m and the substrate platform with SOI layers has a thickness between 650 mu.m to 675 mu.m. The lower (102) rocking curve FWHM value is a consequence of the lower epilayer bowing.

In addition, both symmetrical and asymmetrical plane diffraction spectra were studied to estimate the dislocation density in GaN. The average screw dislocations measured from the 6-inch GaN-SOI were about $4.0 \times 10^8$ cm$^{-2}$ whereas the estimated edge dislocation density was about $8.5 \times 10^8$ cm$^{-2}$. This shows high quality GaN-SOI structure and improved crystalline properties suitable for use in high-performance devices.

Example 5

Characterization—Layer Thickness

Figure 4A:
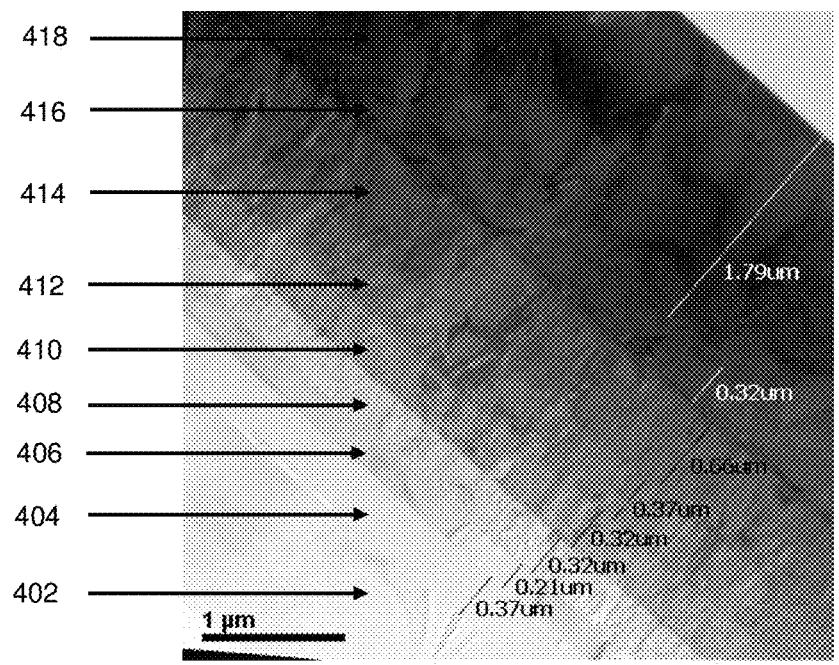
FIGS. 4 (a) and (b) are Cross-sectional transmission electron microscopy (XTEM) images of the layer structures grown on the SOI substrate.
Figure 4B:
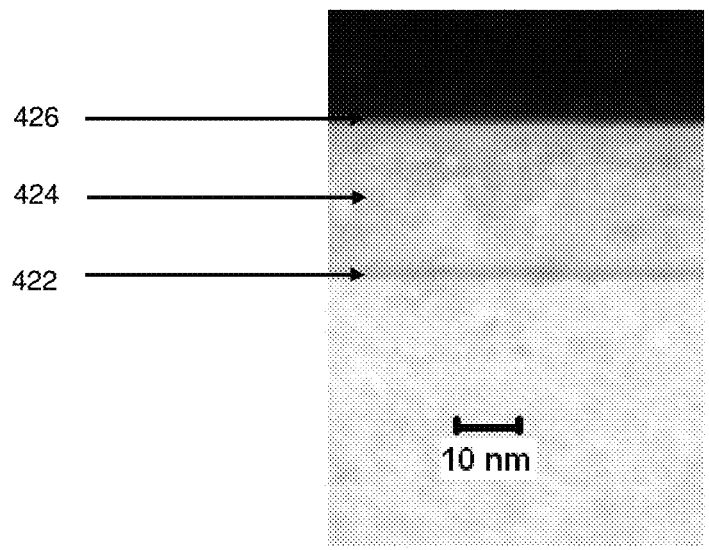

The layer thicknesses of the full epilayer structure were studied by transmission electron microscopy (TEM) imaging. The TEM micrographs of the AlGaN/GaN heterostructure grown on SOI are shown in FIG. 4 (a). The buried oxide layer (BOX) 402, the silicon dioxide layer 404, SOI layer 406, AlN layer 408, first AlGaN layer 410, second AlGaN layer 412, third AlGaN layer 414, first high pressure GaN layer 416 and second low pressure GaN layer 418 are shown.

To accurately probe the thickness profiles of the AlN/AlGaN/GaN 2DEG interfaces and the nature of the dislocation propagation, high-angle annular dark-field scanning transmission electron microscopy (HAADF-STEM) was also performed. FIG. 4 (b) shows the z-contrast HAADF-STEM images with GaN/AlGaN/AlN interfaces where the 1.2 nm thick AlN layer 422, 26.0 nm AlGaN layer 424 and the 1.1 nm GaN cap 426 can be observed. The HAADF-STEM image shows the AlGaN barrier layer profile with much improved contrast than conventional bright field TEM. The use of bottom AlGaN layer 410, 412 and 414 with AlN layer 408 led to the realization of crack-free layers on a 150 mm SOI structure 406.

Example 6

Characterization—Al Content in the Epilayer

Microphotoluminescence measurement with 266 nm laser excitation and micro-Raman measurements with 325 nm excitations were used to estimate Al content in the epilayer structures, Al content was estimated to be about 20 percent for HEMT layers grown on SOI substrates. Due to the presence of a small amount of wafer bowing, the Al composition variation in the AlGaN barrier led to electron mobility variation of about 10 percent.

Comparative Example 1

AlGaN/GaN HEMT on Bulk Si

A comparative study of a similar epilayer given in Example 2 but on bulk Si instead of an SOI substrate (of the same substrate thickness) resulted in bowing of the epilayer greater than 80 mu.m, showing that bowing is significantly reduced when the epilayer is grown on an SOI substrate compared to bulk Si Further, a comparative study of a similar epilayer given in Example 4 but on bulk Si instead of an SOI substrate (same substrate thickness) has resulted in a small increase of (002) rocking curve FWHM to 460 arcsec but a substantial increase of (102) rocking curve FWHM to >800 arcsecs. This, combined with the fact that when bulk Si is used as a substrate, the bowing of the epilayer structure is greater than 80 mu.m, shows that edge dislocations in GaN on bulk Si is increased compared to GaN on SOI.

Figure 5:
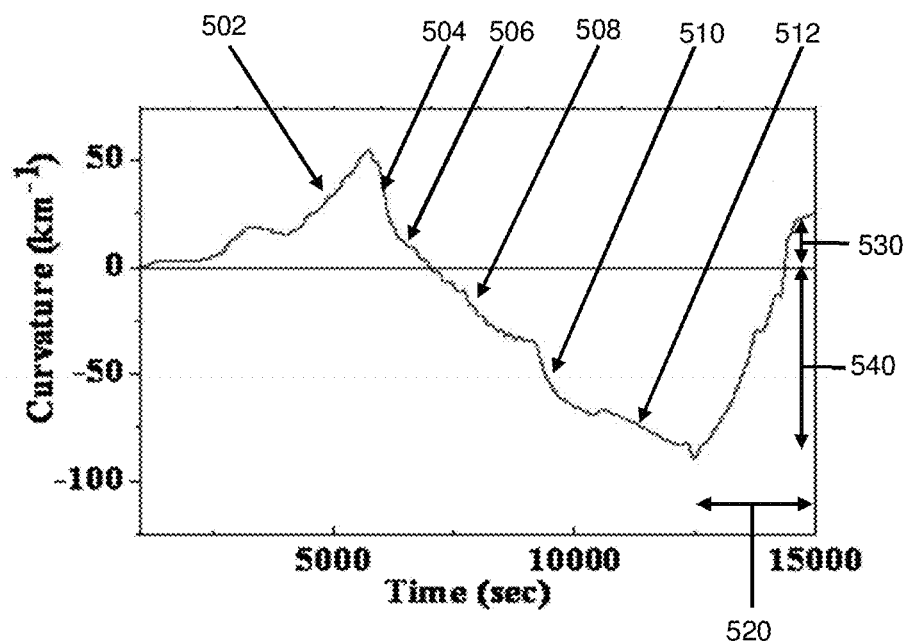
FIG. 5 is a graph depicting the in-situ curvature of the GaN grown on a 150 mm diameter Si substrate.

The AlN (002) rocking curve FWHM was also measured to be around 980 arcsec when grown on SOI compared to 1080 arcsec when grown on bulk Si. This further shows that the improvement in the quality of the AlN layer resulted in HEMT layers with exceptional crystalline quality. FIG. 5 is a graph 501 that shows an example of in-situ curvature of epitaxial layers grown on bulk Si substrate. The graph shows the AlN layer 502, first AlGaN layer 504, second AlGaN layer 506, third AlGaN layer 508, first GaN layer 510, second GaN layer 512, the cool down period 520 and the where the epilayer is concave 530 and convex 540.

TABLE 1

A table comparing curvature of samples A (high curvature) and B (low curvature), respectively, grown on 150 mm Si substrates.

| 150 mm diameter | HRXRD FWHM (arcsec) | | HRXRD FWHM (arsecs) |
|---|---|---|---|
| Sample | GaN(002) | GaN(102) | AlN (002) |
| Bulk Si wafer series: bowing >80 micrometer | 420-500 | 800-1000 | 1050-1100 |
| SOI wafer series: bowing <50 micrometer | 400-460 | 470-520 | 950-1000 |

Comparative Example 2

AlGaN/GaN HEMT on 200 mm Diameter Silicon

Two samples A and B were chosen from different batches of growth sequences that resulted in different wafer bowing using 200 mm diameter bulk Si substrates.

Sample A was grown with a comparatively thinner AlN nucleation layer that resulted in a higher wafer bow greater than or equal to 80 mu.m, although total stack thickness was lower than sample B series. Sample B was grown with a thicker AlN nucleation layer. Sample B shows crack-free growth of the HEMT structure which had a total stack thickness greater than or equal to 4.4 mu.m and wafer bowing less than or equal to 50 mu.m.

Figures 6A, 6B:
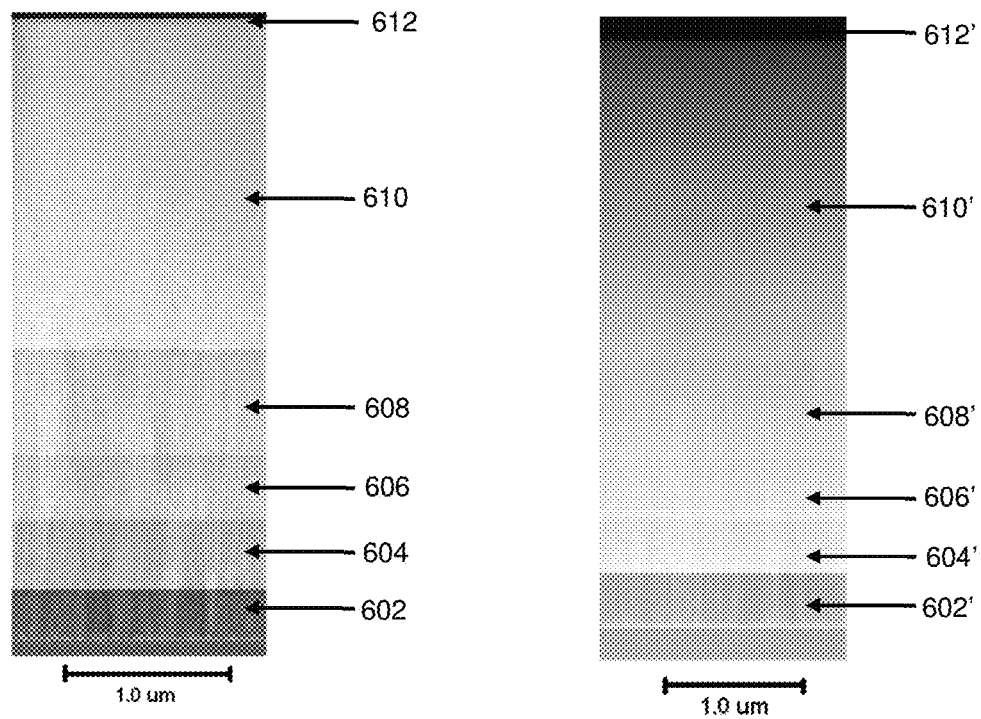
FIGS. 6 (a) and (b) are cross-sectional high-annular dark-field scanning transmission electron microscopy (HAADF-STEM) images of sample A (high curvature) and sample B (low curvature), HEMT structure grown on 200 mm Si substrates.

The comparative cross-sectional z-contrast HAADF scanning TEM images of the full HEMT stack of sample A and sample B are shown in FIGS. 6 (a) and (b), respectively. From FIGS. 6 (a) and (b), AlN nucleation layer 602 and 602' and AlGaN buffer layers 604, 606, 608 and 604", 606', 609', respectively, can be observed to determine individual layer thicknesses. In sample A, the AlN layer 602, the first AlGaN layer 604, the second AlGaN layer 606 and third AlGaN layer 608, the GaN layer 610 and the HEMT layer 612 have thicknesses of 327 nm, 442 nm, 418 nm, 676 nm, 2.13 mu.m and 27 nm, respectively. In sample B, the AlN layer 602', the first AlGaN layer 604', the second AlGaN layer 606' and third AlGaN layer 608', the GaN layer 610' and the HEMT layer 612' have thicknesses of 398 nm, 386 nm, 435 nm, 710 nm, 2.44 mu.m and 25.9 nm respectively. These results show that by using thicker AlN/AlGaN layers and relatively thick GaN overgrowth, low wafer bowing can be achieved which results in a remarkable improvement in uniformity of the layers and electrical properties of the device.

APPLICATIONS

The semiconductor device may be suitable for use in high-power applications.

The semiconductor device may have less strain in the structure due to decreased bowing.

The semiconductor device may have superior crystalline quality in the epilayers.

The semiconductor device may have improved electrical properties as an high electron mobility transistor (HEMT device).

The method of synthesis for the semiconductor device may circumvent the use of inefficient conventional techniques that may also compromise the performance of the device.

The method of synthesis for the semiconductor device may have useful applications in high-frequency amplification and high-power switching devices in the electronics industry.

The semiconductor device may be used in communication satellites, power amplifiers and invertors/converters for electric and/or hybrid vehicles.

The semiconductor device may not require the use of costly substrates.

The semiconductor device may reduce manufacturing time.

The method of synthesis for the semiconductor device may lead to energy savings since the process is more time- and cost-efficient.

It will be apparent that various other modifications and adaptations of the invention will be apparent to the person skilled in the art after reading the foregoing disclosure without departing from the spirit and scope of the invention and it is intended that all such modifications and adaptations come within the scope of the appended claims.

The invention claimed is:

1. A method of making a semiconductor device, the method comprising the steps of:
   (a) providing a silicon-on-insulator (SOI) substrate, wherein the step of providing the silicon-on-insulator (SOI) substrate comprises providing the SOI substrate that is comprised of a bulk Si (111) handle substrate;
   (b) depositing a metal-nitride layer on the substrate, comprising the step of depositing a low-temperature metal-nitride layer on the substrate at a temperature in the range of about 900° C. to about 1000° C. and at a thickness in the range of 30 nm to 50 nm, and depositing a high temperature metal-nitride layer directly onto the low-temperature metal-nitride layer at a temperature in the range of about 1050° C. to about 1075° C. and at a thickness greater than 300 nm;
   (c) depositing a metal-group (III)-nitride layer on the metal-nitride layer; and
   (d) depositing a high pressure group (III)-nitride layer directly on the metal-group (III)-nitride layer at a pressure in the range of about 200 Torr to about 400 Torr and depositing a low pressure group (III)-nitride layer at a pressure in the range of about 150 Torr to about 190 Torr directly adjacent to the high pressure group (III)-nitride layer to form a compositionally homogeneous group (III)-nitride layer, wherein the compositionally homogeneous group (III)-nitride layer has a thickness dimension greater than a thickness dimension of a combination of the metal-nitride layer and the metal-group (III)-nitride layer.

2. The method as claimed in claim 1, wherein the homogeneous group (III)-nitride layer comprises gallium nitride (GaN) to form a GaN layer, the metal-group (III) nitride layer comprises aluminium gallium nitride (AlGaN) to form a AlGaN layer, the metal-nitride layer comprises aluminium nitride (AlN) to form a AlN layer and the step of depositing the AlN layer in step (b) and the step of depositing the AlGaN layer in step (c) comprises the depositing of Al in the AlN layer and in the AlGaN layer in an amount to reduce strain between the GaN layer and SOI substrate.

3. The method as claimed in claim 2, comprising the step of reducing the amount of Al in the AlGaN layer during step (c).

4. The method as claimed in claim 3, wherein the reducing step comprises depositing discrete layers of decreasing Al content in the AlGaN layer.

5. The method as claimed in claim 2, wherein depositing the AlN layer is performed using an alkyl metal in the presence of a nitrogen source.

6. The method as claimed in claim 2, wherein step (c) comprises the steps of:
   measuring the curvature of the substrate; and
   adjusting an amount of AlGaN being deposited during deposition.

7. The method as claimed in claim 1, wherein all the deposition steps are performed using metal organic chemical vapour deposition (MOCVD).

\* \* \* \* \*